US008624471B1

(12) United States Patent
Ayazi et al.

(10) Patent No.: US 8,624,471 B1
(45) Date of Patent: Jan. 7, 2014

(54) PIEZOELECTRIC-ON-SEMICONDUCTOR MICROMECHANICAL RESONATORS WITH LINEAR ACOUSTIC BANDGAP TETHERS

(75) Inventors: Farrokh Ayazi, Atlanta, GA (US); Logan Sorenson, Atlanta, GA (US); Jenna Fu, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 375 days.

(21) Appl. No.: 13/194,921

(22) Filed: Jul. 30, 2011

Related U.S. Application Data (60) Provisional application No. 61/369,106, filed on Jul. 30, 2010.

(51) Int. Cl.
*H03H 9/205* (2006.01)

(52) U.S. Cl.
USPC .......................................... 310/351; 310/353

(58) Field of Classification Search
USPC .................................. 310/311, 348, 351–353
See application file for complete search history.

(56) References Cited

U.S. PATENT DOCUMENTS

| 4,350,918 | A | 9/1982 | Sato |
| 6,525,880 | B2* | 2/2003 | Flanders et al. ............... 359/578 |
| 6,720,714 | B2* | 4/2004 | Ishitoko et al. ............... 310/351 |
| 6,798,729 | B1* | 9/2004 | Hurst et al. .................... 369/119 |
| 7,176,770 | B2 | 2/2007 | Ayazi et al. |
| 7,550,899 | B2* | 6/2009 | Fujiwara et al. ............... 310/324 |
| 7,639,105 | B2 | 12/2009 | Ayazi et al. |
| 7,800,282 | B2 | 9/2010 | Ayazi et al. |
| 7,843,284 | B2 | 11/2010 | Ayazi et al. |
| 7,888,843 | B2 | 2/2011 | Ayazi et al. |
| 7,915,974 | B2* | 3/2011 | Piazza et al. .................. 333/186 |
| 7,924,119 | B1 | 4/2011 | Ayazi et al. |
| 7,939,990 | B2 | 5/2011 | Wang et al. |
| 8,241,296 | B2* | 8/2012 | Wasielewski .................. 606/96 |

(Continued)

FOREIGN PATENT DOCUMENTS

JP         52-42088  A  *  4/1977 ..................... 310/351

OTHER PUBLICATIONS

Sorenson et al., "Linear-Acoustic Bandgap Arrays for Spurious Mode Suppression in Piezoelectric MEMS Resonators," 2011 Joint Conference of the IEEE International Frequency Control Symposium and European Frequency and Time Forum, San Francisco, California, May 2-5, 2011, 5 pages.
Sorenson et al., "One-Dimensional Linear Acoustic Bandgap Structures for Performance Enhancement of AlN-on-Silicon Micromechanical Resonators," The 16th International Conference on Solid-State Sensors, Actuators and Microsystems, Beijing, China, Jun. 7, 2011, 4 pages.

(Continued)

*Primary Examiner* — Thomas Dougherty
(74) *Attorney, Agent, or Firm* — Myers Bigel Sibley & Sajovec (57) ABSTRACT

Microelectromechanical resonators include a resonator body anchored to a substrate by at least one tether containing a coupled-ring linear acoustic bandgap structure therein. The coupled-ring linear acoustic bandgap structure can include a plurality of piezoelectric-on-semiconductor rings connected together by a plurality of piezoelectric-on-semiconductor tether segments. A first electrode may also be provided, which extends on the resonator body and the coupled-ring linear acoustic bandgap structure. This resonator body, which may be suspended opposite a recess in the substrate, may include a semiconductor (e.g., silicon) body having a piezoelectric layer (e.g., AlN) thereon, which extends between the semiconductor body and the first electrode. The coupled-ring linear acoustic bandgap structure may be a periodic structure, where a pitch between each of the plurality of piezoelectric-on-semiconductor rings in the at least one tether is equivalent, or a non-periodic structure.

20 Claims, 5 Drawing Sheets (56) References Cited

U.S. PATENT DOCUMENTS

| | | | | |
|---|---|---|---|---|
| 2002/0151816 A1* | 10/2002 | Rich et al. | ............ | 600/547 |
| 2005/0005676 A1* | 1/2005 | Crawley et al. | ............ | 73/24.01 |
| 2005/0177223 A1* | 8/2005 | Palmaz | ............ | 623/1.15 |
| 2009/0223299 A1* | 9/2009 | Kotovsky | ............ | 73/777 |
| 2010/0156566 A1* | 6/2010 | Abdolvand et al. | ............ | 333/195 |
| 2011/0128094 A1 | 6/2011 | Huang et al. | | |
| 2012/0203177 A1* | 8/2012 | Lanier et al. | ............ | 604/151 |

OTHER PUBLICATIONS

Hsu et al., "Design of Lossless Anchors for Microacoustic-wave Resonators Utilizing Phononic Crystal Strips," American Institute of Physics, Applied Physics Letters 98, 143505 (2011), 3 pages.

Hsu et al., "Acoustic Band Gaps in Phononic Crystal Strip Waveguides," American Institute of Physics, Applied Physics Letters 96, 051902 (2010), 3 pages.

* cited by examiner

PIEZOELECTRIC-ON-SEMICONDUCTOR MICROMECHANICAL RESONATORS WITH LINEAR ACOUSTIC BANDGAP TETHERS

REFERENCE TO PRIORITY APPLICATION

This application claims priority to U.S. Provisional Application Ser. No. 61/369,106, filed Jul. 30, 2010, the disclosure of which is hereby incorporated herein by reference.

FIELD OF THE INVENTION

The present invention relates to integrated circuit devices and, more particularly, to microelectromechanical resonator devices.

BACKGROUND OF THE INVENTION

Frequency references provided by oscillators are required in every clocked electronic system, including communication circuits, microprocessors, and signal processing circuits. Oscillators frequently consist of high performance piezoelectric crystals, such as quartz oscillators. The advantages of quartz oscillators are their stable operating frequency and high quality factor. However, the disadvantages of quartz oscillators are their relatively large size and unsuitability for high integration with electronic circuitry (e.g., CMOS circuits).

Based on these limitations of conventional oscillators, there is a strong interest in the development of fully integrated silicon oscillators. Integration is important not only for reduced size but also reduced power consumption. It is possible to realize an integrated silicon oscillator using the mechanical properties of silicon devices. For example, silicon microelectromechanical (MEMs) resonators can provide small form factor, ease of integration with conventional semiconductor fabrication techniques and high f•Q products. Accordingly, MEMs resonators are considered a desirable alternative to quartz resonators in real-time and other clock applications.

Figure 1A:
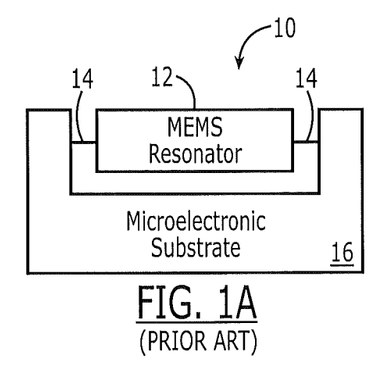
FIG. 1A is a cross-sectional schematic of a conventional microelectromechanical resonator.
Figure 1B:
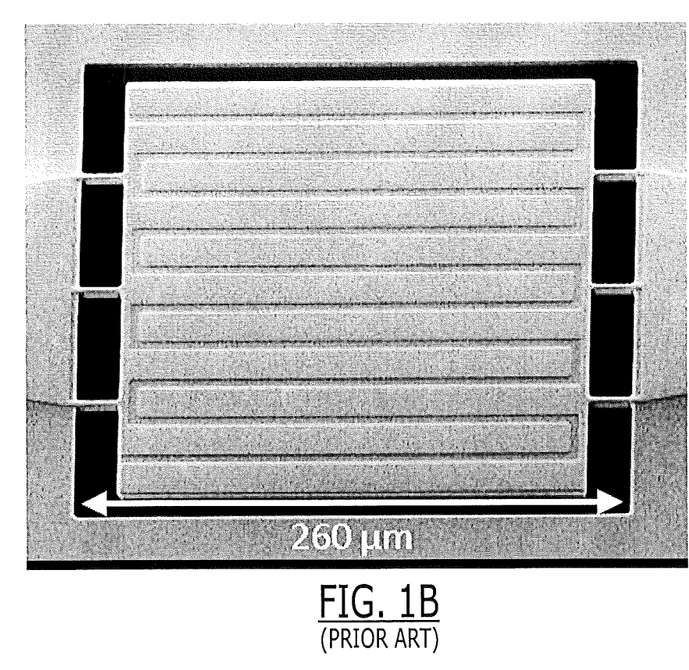
FIG. 1B is an SEM image of an 11th-order AlN-on-Si resonator according to the prior art.

One example of a MEMs resonator includes lateral-mode piezoelectric resonators, such as thin-film piezoelectric-on-silicon (TPoS) resonators, which have been successfully incorporated in low-power and low-noise oscillators. FIG. 1A illustrates a conventional MEMs resonator 10 containing a resonator body 12 that is suspended opposite a recess in a substrate 16 by a pair of opposing tethers 14. This resonator body 12 may include a stack of multiple layers, including a semiconductor body, a bottom electrode on the semiconductor body, a piezoelectric layer on the bottom electrode and a plurality of top electrodes on the piezoelectric layer. The recess may be formed by selectively removing portions of a buried insulating layer within a semiconductor-on-insulator (SOI) substrate 16 containing a semiconductor device layer thereon. FIG. 1B is an SEM image of an 11th-order AlN-on-Si resonator fabricated on a 10 μm silicon-on-insulator (SOI) substrate. This resonator, which includes 11 interdigitated electrode fingers at a 20 μm pitch, includes three pairs of conventional beam supports (20 μm×2 μm) that operate to tether a suspended main body of the resonator to a surrounding substrate.

Other examples of these types of resonators are disclosed in U.S. Pat. No. 7,939,990 to Wang et al., entitled "Thin-Film Bulk Acoustic Resonators Having Perforated Bodies That Provide Reduced Susceptibility to Process-Induced Lateral Dimension Variations," and in U.S. Pat. No. 7,888,843 to Ayazi et al., entitled "Thin-Film Piezoelectric-on-Insulator Resonators Having Perforated Resonator Bodies Therein," the disclosures of which are hereby incorporated herein by reference.

Active frequency tuning techniques may also be utilized to improve MEMs resonator performance by, among other things, reducing the strength of spurious resonance modes that typically limit the quality factor (Q) of the resonator at a desired resonant frequency. Some examples of active frequency tuning in micromechanical resonators are disclosed in U.S. Pat. Nos. 7,639,105 and 7,843,284 to Ayazi et al., entitled "Lithographically-Defined Multi-Standard Multi-Frequency High-Q Tunable Micromechanical Resonators," and in U.S. Pat. No. 7,924,119 to Ayazi et al., entitled Micromechanical Bulk Acoustic Mode Resonators Having Interdigitated Electrodes and Multiple Pairs of Anchor Supports," and in U.S. Pat. No. 7,800,282 to Ayazi et al., entitled Single-Resonator Dual-Frequency Lateral-Extension Mode Piezoelectric Oscillators, and Operating Methods Thereof," the disclosures of which are hereby incorporated herein by reference.

Unfortunately, while piezoelectric MEMs resonators may be interfaced with tuning and other oscillator electronics, such as transimpedance amplifiers, the appearance of sufficiently-strong low-Q spurious modes near the designed operation frequency of the resonator can cause degraded oscillator performance. For example, oscillator phase and gain conditions may cause a spurious mode to become preferred over a desired mode during start-up, causing an oscillator to lock into the spurious mode. In addition, feedthrough and coupling between the desired and spurious modes can degrade phase noise performance and increase frequency instability.

SUMMARY OF THE INVENTION

Microelectromechanical resonators according to some embodiments of the invention include a resonator body anchored to a substrate by at least one tether containing a coupled-ring linear acoustic bandgap structure therein. In some of these embodiments of the invention, the coupled-ring linear acoustic bandgap structure can include a plurality of piezoelectric-on-semiconductor rings connected together by a plurality of piezoelectric-on-semiconductor tether segments. Temperature compensation may also be provided by at least partially filling an interior of the rings with a material (e.g., silicon dioxide) have an opposite temperature coefficient of elasticity (TCE) relative to the rings. A first electrode may also be provided, which extends on the resonator body and the coupled-ring linear acoustic bandgap structure. This resonator body, which may be suspended opposite a recess in the substrate, may include a semiconductor (e.g., silicon) body having a piezoelectric layer (e.g., AlN) thereon, which extends between the semiconductor body and the first electrode. In some embodiments of the invention, a bottom electrode may be provided, which extends between the piezoelectric layer and the semiconductor body. The coupled-ring linear acoustic bandgap structure may be a periodic structure, where a pitch between each of the plurality of piezoelectric-on-semiconductor rings in the at least one tether is equivalent, or a non-periodic structure.

According to still further embodiments of the invention, the coupled-ring linear acoustic bandgap structure may be a tapered structure having different sized rings therein. In addition, the at least one tether may include a series combination of a coupled-ring structure and an S-wave linear acoustic bandgap structure.

According to still further embodiments of the invention, a microelectromechanical resonator includes a piezoelectric-on-semiconductor resonator body having at least a pair of electrodes thereon configured to support piezoelectric transduction therein during resonance. This resonator body is anchored to a substrate by at least one tether containing a linear acoustic bandgap structure. In some of these embodiments of the invention, the linear acoustic bandgap structure includes a linear acoustic diode structure, which can be configured to support a directionally-asymmetric phonon dispersion characteristic as a function of frequency and acoustic wavevector. According to alternative embodiments of the invention, the linear acoustic bandgap structure includes an S-wave linear acoustic bandgap structure. The resonator body may also be anchored to a substrate by at least one tether containing first and second different linear acoustic bandgap structures mechanically coupled in series between an edge of the resonator body and the substrate.

According to still further embodiments of the invention, a microelectromechanical resonator may include a piezoelectric-on-semiconductor resonator body having at least a pair of electrodes thereon. This resonator body is anchored to a substrate by at least one tether comprising a non-periodic linear acoustic bandgap structure. The non-periodic linear acoustic bandgap structure includes a tapered linear acoustic bandgap structure having at least one of an exponentially-scaled and a linearly-scaled basis therein.

DETAILED DESCRIPTION OF EMBODIMENTS

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that when an element or layer is referred to as being "on," "connected to" or "coupled to" another element or layer (and variants thereof), it can be directly on, connected or coupled to the other element or layer or intervening elements or layers may be present. In contrast, when an element is referred to as being "directly on," "directly connected to" or "directly coupled to" another element or layer (and variants thereof), there are no intervening elements or layers present. Like reference numerals refer to like elements throughout.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Embodiments of the present invention are described herein with reference to cross-section and perspective illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a sharp angle may be somewhat rounded due to manufacturing techniques/tolerances.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 2A-2F illustrate a plurality of linear acoustic bandgap (LAB) structures according to embodiments of the invention that may be used advantageously as low acoustic loss tethers to achieve increased Q and lower insertion loss (IL) when used with microelectromechanical resonators having suspended resonator bodies therein. Additional examples of these LAB structures are disclosed in articles by coinventors L. Sorenson, Jenna Fu and Farrokh Ayazi, entitled "Linear-Acoustic Bandgap Arrays for Spurious Mode Suppression in Piezoelectric MEMS Resonators," 2011 Joint Conference of the IEEE International Frequency Control Symposium and European Frequency and Time Forum, San Francisco, Calif., May 2-5 (2011); and "One-Dimensional Linear Acoustic Bandgap Structures for Performance Enhancement of AlN-on-Silicon Micromechanical Resonators," The 16th International Conference on Solid-State Sensors, Actuators and Microsystems, Beijing, China, Jun. 7 (2011), the disclosures of which are hereby incorporated herein by reference. Although not wishing to be bound by any theory, the periodic nature of an LAB structure, which can operate as a one-dimensional (1D) phononic crystal (PC), combined with a relatively large acoustic mismatch at the tether/air interface creates acoustic bandgaps, or frequencies of no allowed acoustic propagation. Based on the creation of these bandgaps, LAB structures can be used as Q-enhancing support tethers by tailoring the tethers to confine acoustic energy within a resonator body at the desired operating frequency. This confinement of energy also enables an aggressive tethering approach using LAB structures, where one pair of tethers is used for each finger of an interdigitated piezoelectric-on-semiconductor transducer, to simultaneously improve the support loss component of Q and provide significant attenuation of spurious modes which lie outside of the designed bandgaps.

Figure 2A:
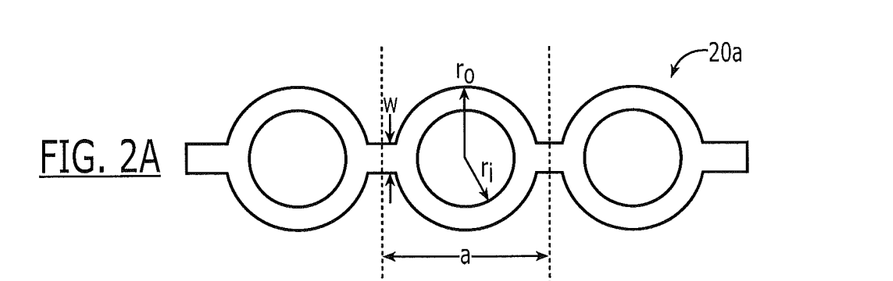
FIGS. 2A-2F are plan views of linear acoustic bandgap resonator tethers 20a-20f according to embodiments of the invention.
Figure 2B:
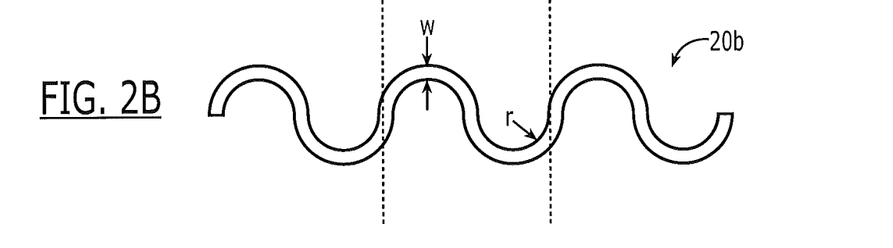
Figure 2C:
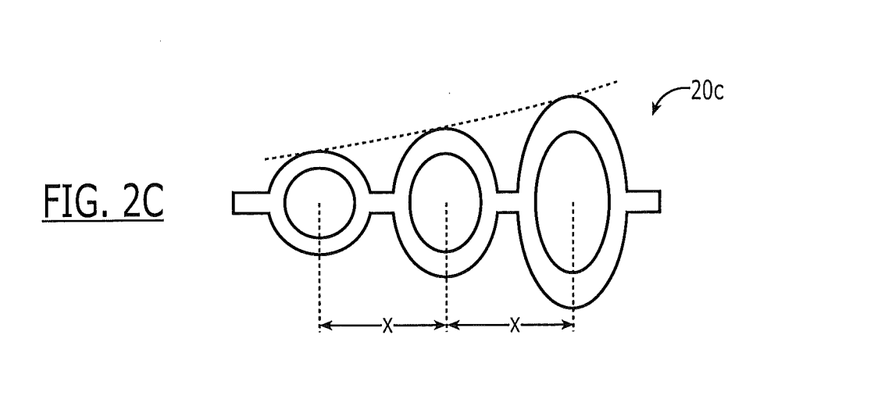
Figure 2D:
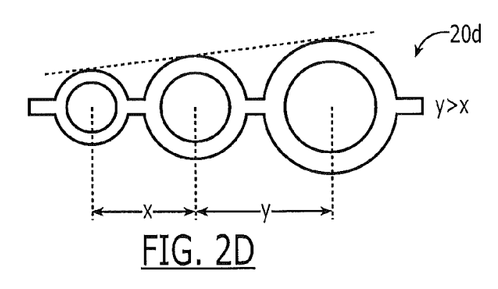
Figure 2E:
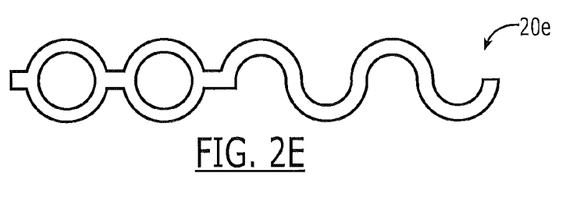
Figure 2F:
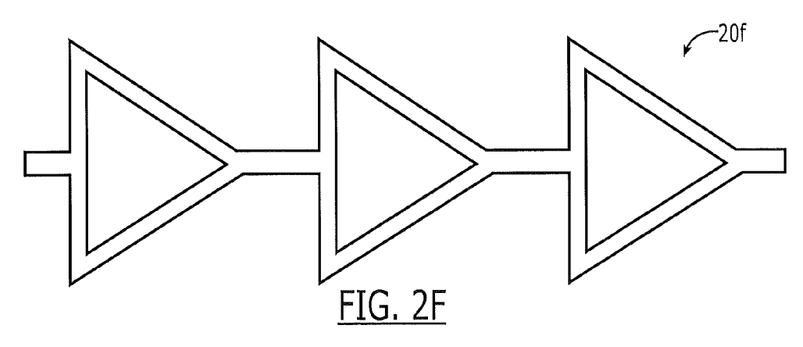

Referring now to FIG. 2A, a coupled-ring linear acoustic bandgap (LAB) structure 20a is illustrated as including a plurality of piezoelectric-on-semiconductor rings connected together by a plurality of piezoelectric-on-semiconductor tether segments. Each of the piezoelectric-on-semiconductor rings (i.e., each basis) is shown as having an inner radius ri and an outer radius ro and each of the tether segments is shown as having a width "w." The LAB structure 20s is a periodic structure with a period "a" that also represents a center-to-center pitch between the coupled rings. FIG. 2B illustrates a periodic S-wave LAB structure 20b having a width "w" and curvature "r." FIG. 2C illustrates a periodic coupled-ring LAB structure 20c having circular and elliptical rings therein with the same center-to-center pitch "x," which demonstrates an exponentially-scaled basis (in a y direction). FIG. 2D illustrates a non-periodic coupled-ring LAB structure 20d having unequally-sized circular rings therein with an increasing center-to-center pitch (e.g., y>x), which demonstrates a linearly-scaled basis (in x and y directions). FIG. 2E illustrates a LAB structure 20e containing a series combination of a coupled-ring structure with an S-wave structure (i.e., an LAB structure having both coupled-ring bases and S-wave bases). FIG. 2F illustrates a periodic LAB structure 20f configured as a linear acoustic "diode," which is configured to support a directionally-asymmetric phonon dispersion characteristic as a function of frequency and acoustic wavevector, which yields directions of preferential acoustic propagation (in 1D).

Figure 3:
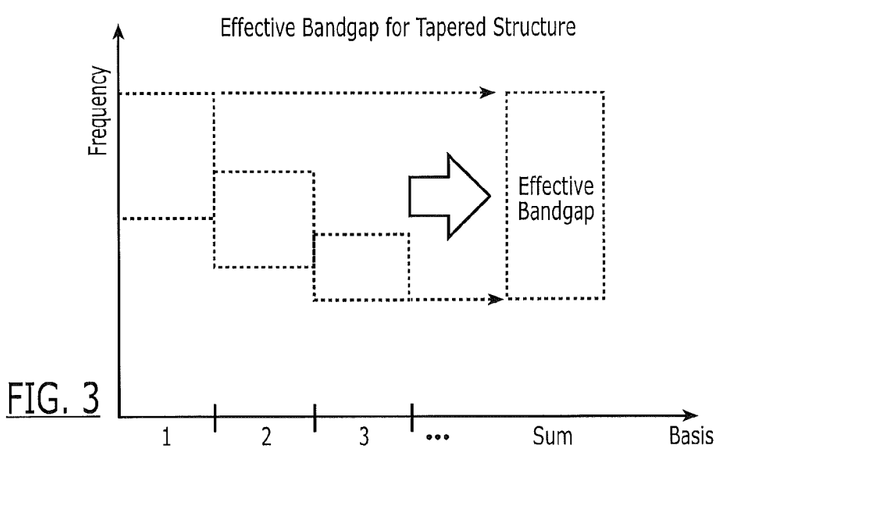
FIG. 3 is a graph conceptually illustrating how the different acoustic bandgaps of LAB structures having different bases can be combined.

FIG. 3 is a graph conceptually illustrating how the different (but overlapping) acoustic bandgaps of LAB structures having different bases can be combined to yield a larger continuous acoustic bandgap when the different LAB structures are combined in series within a resonator tether. Based on this graph, the LAB structures 20c-20e of FIGS. 2C-2E can be expected to have larger acoustic bandgaps (i.e., larger frequency ranges of no acoustic propagation) than otherwise equivalent LAB structures having only a single basis therein.

Figure 4A:
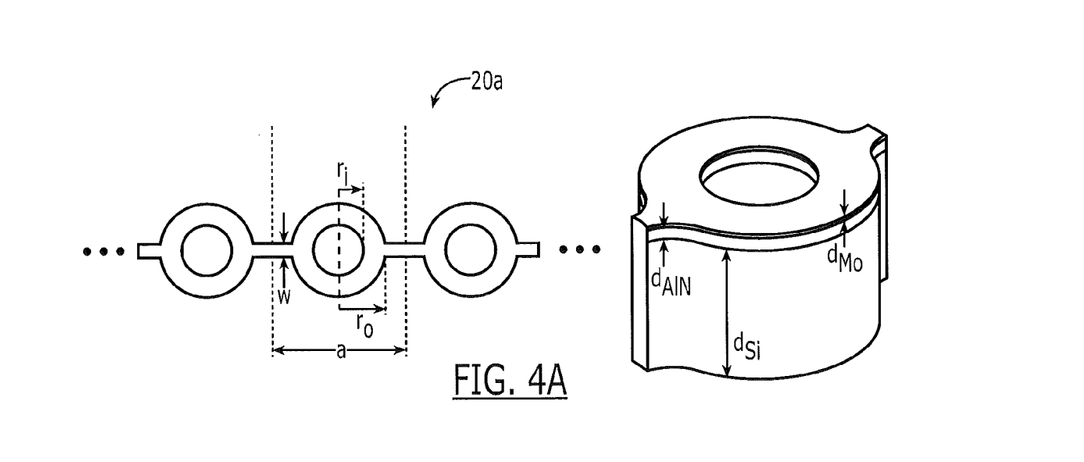
FIG. 4A is a perspective view of a basis of a coupled-ring LAB structure according to an embodiment of the invention.
Figure 4B:
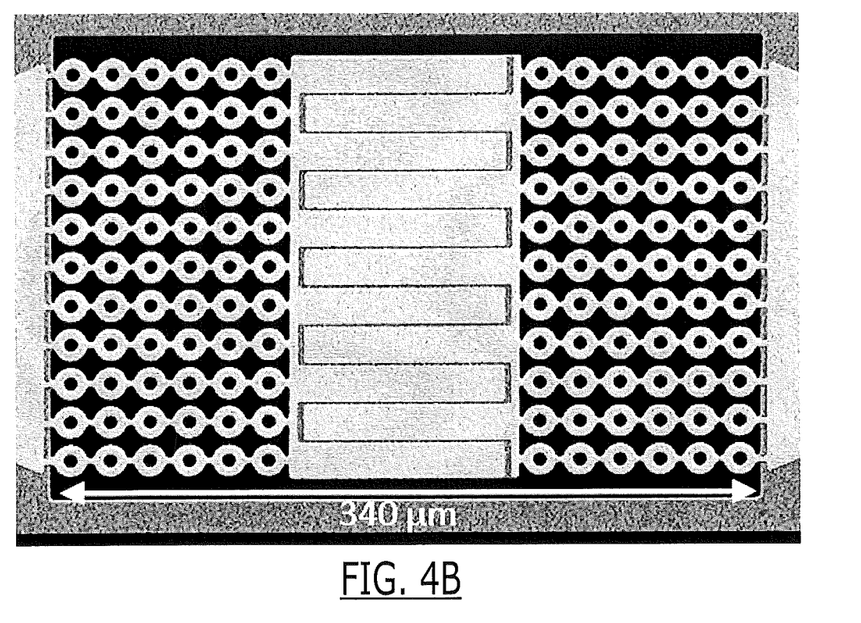
FIG. 4B is an SEM image of an 11th-order AlN-on-Si resonator with 11 pairs of coupled-ring LAB tethers, according to an embodiment of the invention.

FIG. 4A is a three-dimensional perspective view of a basis (i.e., single ring) of a coupled-ring LAB structure 20a (see, e.g., FIG. 2A) containing a piezoelectric-on-semiconductor stack (e.g., AlN-on-Si stack) and an upper electrode layer (e.g., Mo layer) on the piezoelectric layer. A bottom electrode layer (not shown) may also be provided between the piezoelectric layer and the underlying silicon layer in the event the conductivity of the silicon layer is insufficiently high. As described in the aforementioned L. Sorenson et al. articles, the period "a" of the basis may be 20 µm, an inner radius ri may be 4 µm, an outer radius ro may be 8 µm, a tether segment width "w" may be 2 µm, a silicon layer thickness ($d_{Si}$) may be 10 µm, a piezoelectric layer thickness ($d_{AlN}$) may be 1 µm and an electrode thickness ($d_{Mo}$) may be 100 nm. This basis of FIG. 4A may be utilized in the 11th-order AlN-on-Si resonator of FIG. 4B, which was fabricated on a 10 µm silicon-on-insulator (SOI) substrate. This resonator of FIG. 4B, which includes 11 interdigitated upper electrode fingers at a 20 µm pitch, also includes 11 pairs of 6-period coupled-ring LAB tethers at the same pitch as the electrode fingers. These LAB tethers operate to anchor the suspended main body of the resonator to a surrounding substrate. In alternative embodiments of the invention, the LAB tethers of FIG. 4B may be replaced by the LAB structures of FIGS. 2B-2F.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A microelectromechanical resonator, comprising:
a resonator body anchored to a substrate by at least one tether comprising a coupled-ring linear acoustic bandgap structure therein, said coupled-ring linear acoustic bandgap structure comprising a plurality of piezoelectric-on-semiconductor rings connected together by a plurality of piezoelectric-on-semiconductor tether segments.

2. The resonator of claim 1, further comprising a first electrode extending on said resonator body and the coupled-ring linear acoustic bandgap structure.

3. The resonator of claim 2, wherein said resonator body comprises a semiconductor body having a piezoelectric layer thereon; and wherein the piezoelectric layer extends between the semiconductor body and the first electrode.

4. The resonator of claim 3, further comprising a bottom electrode extending between the piezoelectric layer and the semiconductor body.

5. The resonator of claim 1, wherein the coupled-ring linear acoustic bandgap structure is a periodic structure.

6. The resonator of claim 5, wherein a pitch between each of the plurality of piezoelectric-on-semiconductor rings in the at least one tether is equivalent.

7. A microelectromechanical resonator, comprising:
a resonator body anchored to a substrate by at least one tether comprising a coupled-ring linear acoustic bandgap structure therein, which is a tapered structure having different sized rings therein.

8. The resonator of claim 1, wherein the coupled-ring linear acoustic bandgap structure is a tapered structure having different sized piezoelectric-on-semiconductor rings therein.

9. The resonator of claim 7, wherein the coupled-ring linear acoustic bandgap structure is a non-periodic structure.

10. A microelectromechanical resonator, comprising:
a resonator body anchored to a substrate by at least one tether comprising a coupled-ring linear acoustic bandgap structure therein, said at least one tether further comprising an S-wave linear acoustic bandgap structure therein.

11. The resonator of claim 10, wherein the S-wave acoustic bandgap structure is coupled in series with the coupled-ring linear acoustic bandgap structure.

12. A microelectromechanical resonator, comprising:
a resonator body having a piezoelectric layer therein and at least a pair of electrodes on the piezoelectric layer that are configured to support piezoelectric transduction in said resonator body during resonance, said resonator body anchored to a substrate by at least one tether comprising a linear acoustic bandgap structure, said linear acoustic bandgap structure comprising a linear acoustic diode structure.

13. The resonator of claim 12, wherein the linear acoustic diode structure is configured to support a directionally-asymmetric phonon dispersion characteristic as a function of frequency and acoustic wavevector.

14. A microelectromechanical resonator, comprising:
a resonator body having a piezoelectric layer therein and at least a pair of electrodes on the piezoelectric layer, said resonator body anchored to a substrate by at least one tether comprising a non-periodic linear acoustic bandgap structure containing a tapered coupled-ring linear acoustic bandgap structure having at least one of an exponentially-scaled and a linearly-scaled basis therein.

15. A microelectromechanical resonator, comprising:
a resonator body anchored to a substrate by at least one tether comprising at least one linear acoustic bandgap structure therein, said linear acoustic bandgap structure comprising a plurality of spaced-apart tether segments comprising a piezoelectric layer thereon and a first electrode on the piezoelectric layer.

16. The resonator of claim 15, wherein the first electrode extends on said resonator body.

17. The resonator of claim 16, wherein said resonator body comprises a semiconductor body having a piezoelectric layer thereon; and wherein the piezoelectric layer extends between the semiconductor body and the first electrode.

18. The resonator of claim 17, further comprising a bottom electrode extending between the piezoelectric layer and the semiconductor body.

19. The resonator of claim 18, wherein said at least one linear acoustic bandgap structure comprises a coupled-ring linear acoustic bandgap structure.

20. The resonator of claim 15, wherein a pitch between each of the plurality of tether segments is equivalent.

* * * * *